United States Patent
Bruce et al.

(10) Patent No.: US 6,653,849 B1
(45) Date of Patent: Nov. 25, 2003

(54) IC ANALYSIS INVOLVING LOGIC STATE MAPPING IN A SOI DIE

(75) Inventors: Michael R. Bruce, Austin, TX (US); Rama R. Goruganthu, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 83 days.

(21) Appl. No.: 09/864,708

(22) Filed: May 23, 2001

(51) Int. Cl.$^7$ ............................................... G01R 31/02
(52) U.S. Cl. ........................ 324/751; 324/752; 324/765
(58) Field of Search ................................. 324/750, 751, 324/752, 73.1, 765, 158.1, 719; 438/14, 18; 257/48; 250/341.4, 341.8

(56) References Cited

U.S. PATENT DOCUMENTS

| | | | |
|---|---|---|---|
| 5,493,236 A | * | 2/1996 | Ishii et al. .................. 324/752 |
| 5,872,360 A | * | 2/1999 | Paniccia et al. ............. 324/753 |
| 6,020,746 A | * | 2/2000 | Livegood .................... 324/754 |
| 6,366,101 B1 | * | 4/2002 | Bruce .......................... 324/752 |

* cited by examiner

Primary Examiner—Vinh P. Nguyen

(57) ABSTRACT

Analysis of a semiconductor die having silicon-on-insulator (SOI) structure is enhanced by accessing the circuitry within the die from the back side without breaching the thin insulator layer of the SOI structure. According to an example embodiment, a portion of substrate is removed from the back side of a semiconductor die having a SOI structure and a backside opposite circuitry in a circuit side. Electrical connection is made to a portion of the circuitry within the die via a capacitive coupling arrangement. The electrical connection is used to obtain an electrical measurement from the die that is used for analysis.

21 Claims, 2 Drawing Sheets

IC ANALYSIS INVOLVING LOGIC STATE MAPPING IN A SOI DIE

RELATED PATENT DOCUMENTS

The Patent Document is related to U.S. patent application Ser. No. 09/864,665, entitled "Timing Margin Alteration Via the Insulator of a SOI Die," and to U.S. patent application Ser. No. 09/864,688, entitled "Selective State Change Analysis of a SOI Die," now U.S. Patent No. 6,414,335 and both filed concurrently herewith.

FIELD OF THE INVENTION

The present invention relates generally to semiconductor devices and their fabrication and, more particularly, to testing and defect analysis of semiconductor dice involving logic state mapping.

BACKGROUND OF THE INVENTION

The semiconductor industry has recently experienced technological advances that have permitted dramatic increases in integrated circuit density and complexity, and equally dramatic decreases in power consumption and package sizes. Present semiconductor technology now permits single-die microprocessors with many millions of transistors, operating at speeds of hundreds of millions of instructions per second to be packaged in relatively small, air-cooled semiconductor device packages.

A by-product of such high-density and high functionality is an increased demand for products employing these microprocessors and devices for use in numerous applications. As the use of these devices has become more prevalent, the demand for faster operation and better reliability has increased. Such devices often require manufacturing processes that are highly complex and expensive.

As the manufacturing processes for semiconductor devices and integrated circuits increase in difficulty, methods for testing and debugging these devices become increasingly important. Not only is it important to ensure that an individual die is functional, it is also important to ensure that batches of dice perform consistently. In addition, the ability to detect a defective manufacturing process early is helpful for reducing the number of defective devices manufactured.

Traditionally, integrated circuits have been tested using methods including directly accessing circuitry or devices within the integrated circuit. Directly accessing the circuitry is difficult for several reasons. For instance, in flip-chip type dice, transistors and other circuitry are located in a very thin epitaxially grown silicon layer in a circuit side of the die. The circuit side of the die is arranged face-down on a package substrate. This orientation provides many operational advantages. However, due to the face-down orientation of the circuit side of the die, the transistors and other circuitry near the circuit side are not readily accessible for testing, modification, or other purposes. Therefore, access to the transistors and circuitry near the circuit side is from the back side of the die.

One particular type of semiconductor device structure that presents unique challenges to back side circuit analysis is silicon-on-insulator (SOI) structure. SOI involves forming an insulator, such as an oxide, over bulk silicon in the back side of a semiconductor device. A thin layer of silicon is formed on top of the insulator, and is used to form circuitry over the insulator. The resulting SOI structure exhibits benefits including reduced switch capacitance, which leads to faster operation. Direct access to circuitry for analysis of SOI structure, however, involves milling through the oxide. The milling process can damage circuitry or other structure in the device. Such damage can alter the characteristics of the device and render the analysis inaccurate. In addition, the milling process can be time-consuming, difficult to control, and thus expensive.

Another challenge to analysis of integrated circuit dice is correlating a response to a particular portion or portions of circuitry. Often, when dice are tested, the source of a particular detected response is difficult to determine. As integrated circuit-dice are scaled smaller, individual circuit elements are placed closer together. When a response is obtained from a die, the close placement makes it difficult to determine exactly where the response came from. In addition, responses generated are often the result of action at another circuit portion electrically coupled to the response-generating circuit. In this instance it is difficult to determine where the response was actually generated in relation to where it is detected.

The difficulty, cost, and destructive aspects of existing methods for testing integrated circuits are impediments to the growth and improvement of semiconductor technologies involving SOI structure.

SUMMARY OF THE INVENTION

The present invention is directed to a method and system for analyzing a semiconductor die having silicon-on-insulator (SOI) structure in a manner that overcomes the above-discussed impediments. The die includes a back side opposite circuitry in a circuit side, and the die analysis involves electrically coupling to the circuitry with mapping of logic states in the die circuitry. The present invention is exemplified in a number of implementations and applications, some of which are summarized below.

According to an example embodiment of the present invention, a semiconductor die having SOI structure and a back side opposite circuitry in a circuit side is analyzed. The back side of the semiconductor die is thinned, either prior to or as part of the present analysis. The die is operated in a manner that causes circuitry in the die to take on a selected logic state. A probe is used to scan the thinned back side of the die using the insulator portion of the SOI structure as a dielectric to couple to the circuitry. The probe generates a response from the die that is detected and used to detect a logic state of circuitry in the die. The logic state is then mapped to a particular portion of the circuitry. In this manner, the logic state of selected circuitry in the die can be detected under various operating conditions.

According to another example embodiment of the present invention, a system is adapted to analyze a semiconductor die having silicon-on-insulator (SOI) structure and a back side opposite circuitry in a circuit side. A power supply is adapted to operate the die at a selected logic state. A probe is arranged over the back side and adapted to scan the die using the insulator portion of the SOI structure as a dielectric and to detect a response from the scanning. An analysis device is adapted to use the response to detect a logic state of the circuitry and map the logic state to a particular portion of the circuitry.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
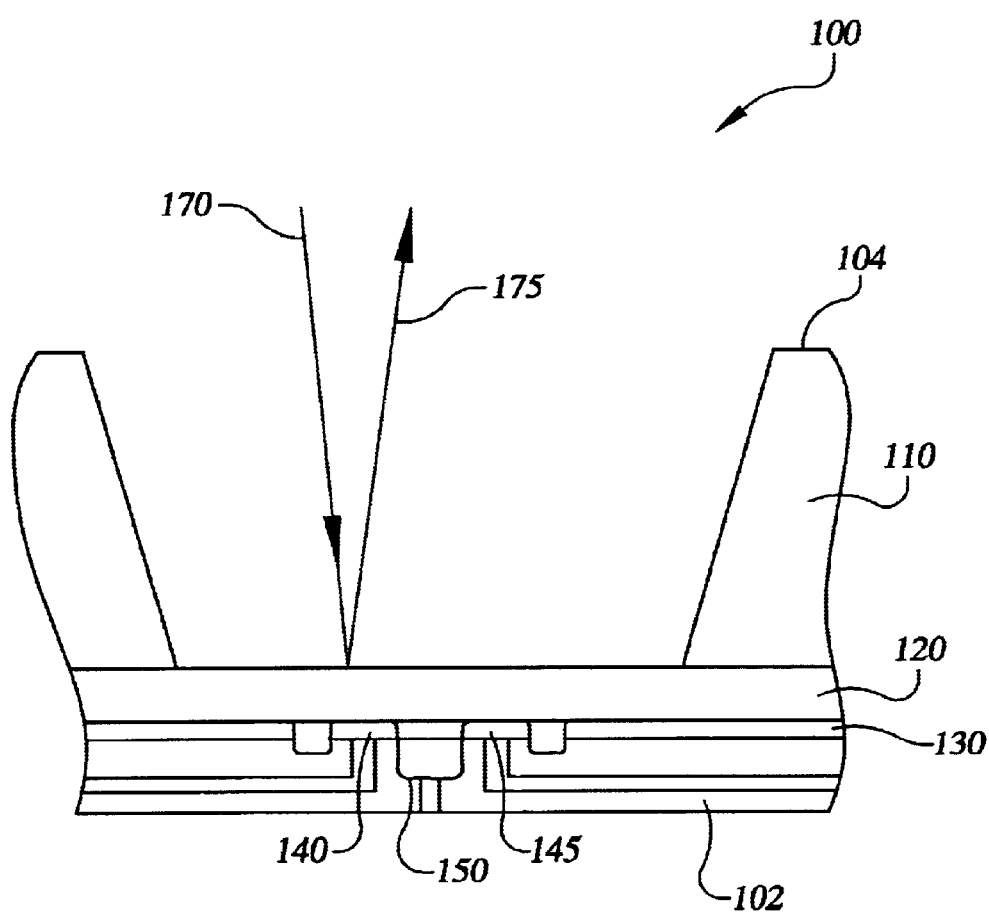
FIG. 1 is a semiconductor die undergoing analysis, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and has been found to be particularly suited for flip-chip and other type devices having silicon-on-insulator (SOI) structure and requiring or benefiting from analysis involving the mapping of logic states. While the present invention is not necessarily limited to such devices, various aspects of the invention may be appreciated through a discussion of various examples using this context.

According to an example embodiment of the present invention, a semiconductor die having a back side opposite circuitry in a circuit side and including SO structure is analyzed using a probing technique for mapping the logic state of one or more portions of circuitry in the die. The probe is scanned over a thinned portion of the die and electrically couples to a portion of circuitry in the die using the insulator portion of the SOI structure as a dielectric. The portion of the die scanned is selected for a particular type of analysis, such as to selectively analyze a particular circuit region, or to analyze the entire die. The die is operated and the circuitry in the die is made to take on a logic state selected for the type of analysis to be performed. The selected logic state may include, for example, a static state, a looped state or a state selected to cause a die failure. A response from the die is detected and used to detect a logic state of the circuitry. The logic state is then mapped to a particular portion of the circuitry, facilitating the ability to not only detect characteristics of the die involving the logic state of selected circuitry, but also to map those characteristics of the particular logic state to circuitry in the die.

Thinning a portion of the die may be accomplished in a variety of manners. In one implementation, the die is received in a thinned state, such as from a manufacturing process or from an analysis lab. In another implementation, the die is thinned as part of the present invention. The portion of the die to be thinned is selected to correspond to the portion of the die to be analyzed, and can include some or all of the back side of the die. Global and local thinning techniques involve removal processes including chemical and mechanical etching and polishing, laser etching and focused ion beam (FIB) assisted etching. The amount of material to be removed from the die is selected to facilitate coupling through the insulator portion of the SOI structure. For example, the insulator itself may be exposed or even milled, or an amount of material can be left over the insulator as long as the probe can still electrically couple to circuitry in the die through the insulator.

In one example embodiment of the present invention, logic states associated with operational failures in a semiconductor die are detected and mapped. One example of such an operational failure results when an electrical signal arrives at a destination too early or too late, resulting in an incorrect value of a logic state of the IC. Circuit elements that can be involved with such failures include, for example, switching transistors or functional circuit blocks that switch between logic states at a rate that is slower than normal, and interconnections in the IC which have a resistance larger than an expected value. In general, anything within an IC that results in or contributes to a particular signal within the IC being advanced or delayed in propagation by one or more lock cycles compared with the time at which the signal should appear can result in an operational failure in the IC.

In one particular example embodiment of the present invention, a semiconductor die is operated near a transition point between pass and fail states. An electron beam probe is directed at a portion of the semiconductor die and couples a voltage to circuitry using the insulator as a dielectric. The probe can be directed at the die, for example, by raster scanning across the thinned portion, stepping the beam across the die, pulsing the beam, or directing the beam in a spot mode to a single portion of the die. A response, such as a change in pass/fail state of the die, is detected and mapped to the portion of the die being scanned as the response is detected.

Comparing responses may include comparing a timing response between the defective die and a reference die, or between in-range and out-of-range specifications using the same die, wherein a change in the logic state indicated by a response from a particular circuit path within the die is an indication that the circuit path may include a defect. The timing discrepancies in the responses are noted and used to identify the defective portion of the die. In one instance, the defective portion is identified using an image of the die. In another instance, a circuit layout of the scanned portion of the die is used to correlate the discrepancies to a defective circuit path in the die, such as by using the coordinates of the defective portion. The suspect circuit path can then further be imaged to more specifically locate a defective portion of the circuit path.

One application for which the present invention is useful involves distinguishing a resistive defect from other operational defects in a die. At times, particular failure modes in a die are used to pinpoint a particular type of defect. However, such failure modes can be inadequate for appropriately locating a defective portion of the die when the die includes a resistive circuit path because such a resistive path can generate a false failure mode. For more information regarding the detection of resistive defects, reference may be made to U.S. patent application Ser. No. 09/586,518 entitled "Resistivity Analysis" and filed on Jun. 2, 2000.

FIG. 1 shows a portion of a flip-chip die 100 exemplifying one type of a variety of dice having SOI structure for which the present invention is applicable. The die of FIG. 1 is shown in an inverted position with a circuitry side 102 facing down and a back side 104 facing up, such as would be found in a flip-chip die bonded to a package substrate. In this instance, a portion of the substrate 110 in the back side 104 has been removed, exposing a portion of the insulator layer 120. Other example embodiments lo involve removing all of the substrate 110, exposing the entire insulator layer 120. The die includes a layer 120 of insulator material and a thin silicon layer 130. Source/drain regions 140 and 145 are located in the thin silicon layer and adjacent the insulator, and a gate 150 is located between the source/drain regions. The gate and source/drain regions in the SOI structure make up a transistor.

An electron beam 170 is directed at a portion of the insulator 120 located over the source/drain region 140. The die is operated so that the transistor is placed in a selected logic state via electrical interconnects in the die. The insulator 120 acts as a dielectric for capacitively coupling to the souce/drain region 140. Secondary electrons generated in response to the beam 175 are detected. The response is used to detect an electrical characteristic at the source/drain region that is capactively coupled to the portion of the insulator to which the beam is directed. In this instance, the electric field generated by the source/drain region affects the emission of secondary electrons. If the source/drain region is at a positive voltage, the emission of secondary electrons is inhibited, and if the voltage is zero or negative, the emission of secondary electrons is generally unaffected. The portion of the die being scanned is correlated with the detected logic state as indicated by the voltage. In this manner, the logic state of the circuitry is revealed and can be mapped to circuitry in the die.

Figure 2:
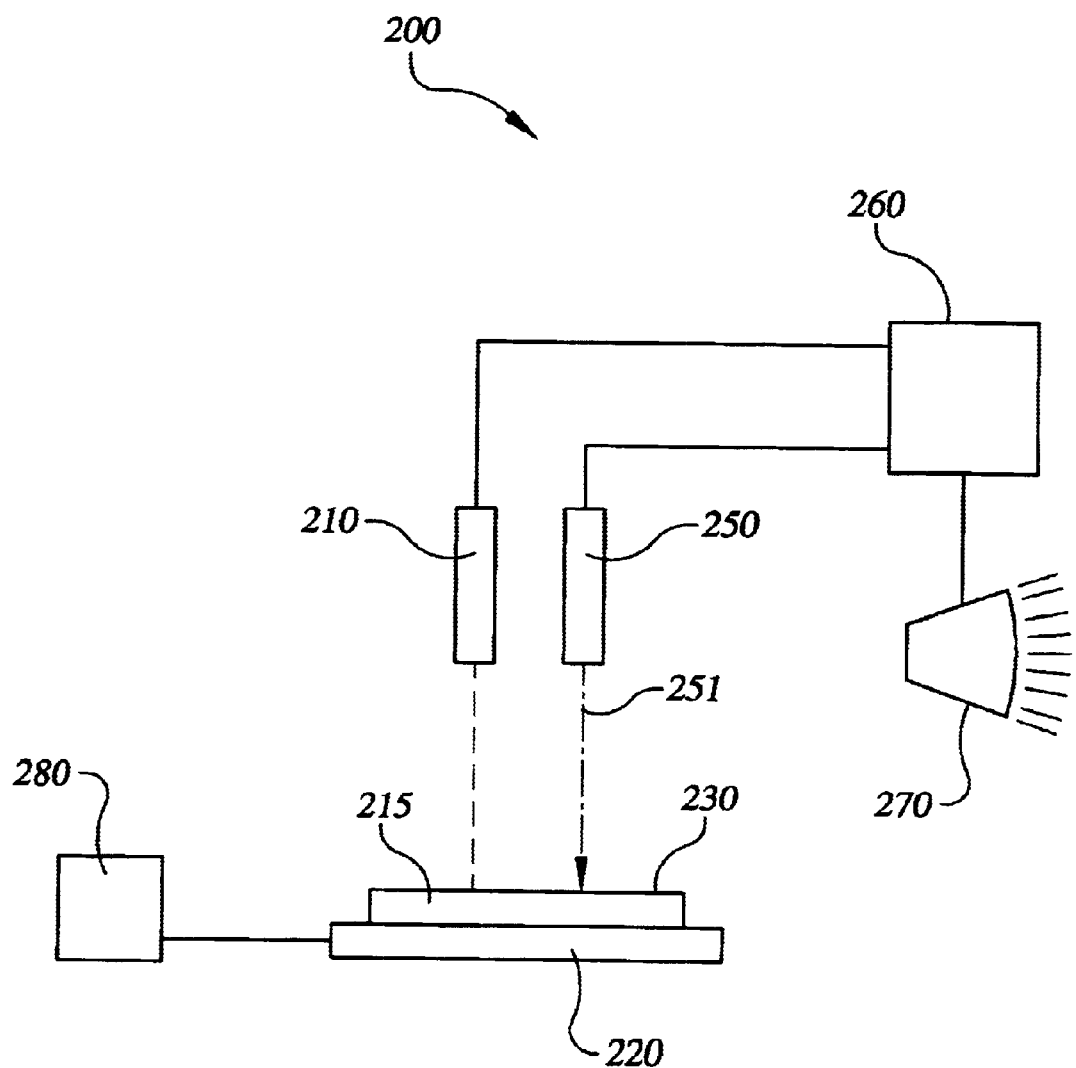
FIG. 2 is a system for analyzing a semiconductor die, according to another example embodiment of the present invention.

According to another example embodiment of the present invention, FIG. 2 shows a system 200 adapted to probe a semiconductor die 215 having SOI structure. The system includes a substrate removal device 210 adapted to remove substrate from a back side of the die and form an exposed region. The die is placed on and electrically coupled to a stage 220. The exposed region is formed leaving a thickness of material over circuitry in the die that is sufficient to facilitate capacitive coupling to the circuitry. In one implementation, the substrate removal device includes a FIB, and in another implementation, the substrate removal device includes a laser etching device.

A probing arrangement 250 is adapted to direct an electron beam 251 at the exposed region of the die and to capacitively couple with a portion of circuitry in the die via the insulator portion of the SOI structure. A power supply 280 is electrically coupled to the die via the stage 220 and is adapted to operate the die in a manner that places selected circuitry in the die into a logic state. As discussed in connection with FIG. 1, a logic state of a portion of circuitry in the die is detected by detecting secondary electrons emitted from the die in response to the probe and the operation of the die. The response is used to determine the logic state of the portion of the die being scanned, and that logic state is mapped to that portion based upon the location of the beam when the response was detected.

Referring again to FIG. 2, the probe arrangement 250 and/or the substrate removal device 210 are optionally coupled to a controller 260 adapted to control the probe arrangement 250 and/or the substrate removal device 210. In one implementation, the controller includes a computer arrangement adapted to receive electrical characteristics of a circuit portion in the die via the probe 250 and interpret those characteristics to determine the logic state of the portion of the die being scanned and to map that logic state to circuitry in the die. In another implementation, the computer arrangement is further programmed to remove a sufficient amount of substrate to facilitate capacitively coupling to the source/drain region. The computer arrangement optionally includes a visual display device 270, such as a monitor or a printer, adapted to display an output relating to the detected logic state of the die.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing a semiconductor die having silicon-on-insulator (SOI) structure and circuitry in a circuit side opposite a back side, the method comprising:
    providing a die having a thinned backside;
    operating the die and causing circuitry in the die to take on a selected logic state;
    scanning the thinned back side with a probe using the insulator portion of the SOI structure as a dielectric and detecting a response from the die; and
    using the response to detect a logic state of the circuitry and mapping the logic state to a particular portion of the circuitry.

2. The method of claim 1, wherein providing a die having a thinned backside includes thinning the die backside and exposing the insulator layer.

3. The method of claim 1, wherein operating the die and causing circuitry to take on a selected logic state includes at least one of: operating the die in a manner that causes a selected portion of the die to fail, and halting the die in a selected logic state.

4. The method of claim 1, wherein scanning the die with a probe includes scanning with an electron beam.

5. The method of claim 4, wherein detecting a response includes detecting at least one of: primary electrons, secondary electrons, and a response from the die induced by the electron beam.

6. The method of claim 4, further comprising capacitively coupling to circuitry in the die using the insulator as a dielectric with the probe and altering the voltage of the circuitry via the coupling.

7. The method of claim 6, wherein detecting a response includes detecting a response capacitively induced by the electron beam.

8. The method of claim 1, wherein scanning the thinned backside includes monitoring the location of the die that is being scanned.

9. The method of claim 8, wherein mapping the logic state includes correlating the monitored location to the detected logic state.

10. The method of claim 1, wherein using the response to detect a logic state includes obtaining a waveform from the data and correlating the waveform with a known waveform associated with a particular logic state.

11. The method of claim 1, further comprising detecting and mapping a logic state of circuitry in a non-defective die in the same manner as the die being analyzed, the non-defective die having the same design as the die being analyzed, and wherein using the response to detect a logic state of the circuitry and mapping the logic state to a portion of the circuitry of the die being analyzed includes comparing the detection and mapping of the non-defective die to that of the die being analyzed.

12. The method of claim 1, wherein scanning the thinned backside includes scanning over a plurality of circuitry regions in the die, wherein detecting a response from the die includes detecting a response from each of the plurality of circuitry regions, and wherein mapping the logic state includes mapping the logic state of the plurality of circuitry regions.

13. A system for analyzing a semiconductor die having silicon-on-insulator (SOI) structure and circuitry in a circuit side, the system comprising:
    means for operating a die having a thinned backside and causing circuitry in the die to take on a selected logic state;

means for probing the thinned backside using the insulator portion of the SOI structure as a dielectric and detecting a response from the probing; and means for using the response to detect a logic state of the circuitry and for mapping the logic state to a particular portion of the circuitry.

14. A system for analyzing a semiconductor die having silicon-on-insulator (SOI) structure and circuitry in a circuit side opposite a back side, the system comprising:

a power supply adapted to operate a die having a thinned back side and cause circuitry in the die to take on a selected logic state;

a probe adapted to scan the thinned backside using the insulator portion of the SOI structure as a dielectric and to detect a response from the scanning; and an analysis device adapted to use the response to detect a logic state of the circuitry and to map the logic state to a particular portion of the circuitry.

15. The system of claim 14, wherein the probe arrangement includes an electron beam probe.

16. The system of claim 15, wherein the probe is further adapted to obtain an image of the die having light and dark areas, the dark areas being indicative of circuit portions having a positive voltage greater than that of lighter areas.

17. The system of claim 14, wherein the probe is adapted to scan over a plurality of circuit regions in the die and to detect a response from the plurality of circuit regions, and wherein the analysis device is adapted to determine the logic state of the circuit regions via the response.

18. The system of claim 14, further comprising a substrate removal arrangement adapted to thin the back side of the die.

19. The system of claim 14, wherein the power supply is adapted to operate the die in at least one of: a static logic state, and a condition selected to cause a failure.

20. The system of claim 14, wherein the analysis device is further electrically coupled to the die, adapted to detect an electrical change to the die induced by the probe and to use the detected electrical change in combination with the response to the scanning to map the logic state.

21. The system of claim 14, wherein the analysis device is adapted to map the logic state to a particular portion of the circuitry by matching the response with the coordinates of the die upon which the probe is being scanned when the response was detected.

* * * * *

UNITED STATES PATENT AND TRADEMARK OFFICE
CERTIFICATE OF CORRECTION

PATENT NO. : 6,653,849 B1
DATED : November 25, 2003
INVENTOR(S) : Bruce et al.

It is certified that error appears in the above-identified patent and that said Letters Patent is hereby corrected as shown below:

Column 5,
Line 8, "souce/drain" should read -- source/drain --.

Signed and Sealed this

Tenth Day of February, 2004

JON W. DUDAS
*Acting Director of the United States Patent and Trademark Office*